(12) United States Patent
Marsden

(10) Patent No.: US 11,401,013 B2
(45) Date of Patent: Aug. 2, 2022

(54) SHIFT INTERRUPT METHOD FOR A MARINE PROPULSION SYSTEM

(71) Applicant: Jacob Marsden, Boulder City, NV (US)

(72) Inventor: Jacob Marsden, Boulder City, NV (US)

(*) Notice: Subject to any disclaimer, the term of this patent is extended or adjusted under 35 U.S.C. 154(b) by 286 days.

(21) Appl. No.: 16/554,530

(22) Filed: Aug. 28, 2019

(65) Prior Publication Data

US 2020/0108900 A1  Apr. 9, 2020

Related U.S. Application Data

(60) Provisional application No. 62/725,125, filed on Aug. 30, 2018.

(51) Int. Cl.
| | | |
|---|---|---|
| *B63B 79/40* | (2020.01) | |
| *B63B 79/10* | (2020.01) | |
| *G01R 33/07* | (2006.01) | |
| *H02K 11/215* | (2016.01) | |

(52) U.S. Cl.
CPC .............. *B63B 79/40* (2020.01); *B63B 79/10* (2020.01); *G01R 33/07* (2013.01); *H02K 11/215* (2016.01)

(58) Field of Classification Search
CPC .......... B63B 79/40; B63B 79/10; F02P 11/02; B63H 21/213
See application file for complete search history.

(56) References Cited

U.S. PATENT DOCUMENTS

| | | | |
|---|---|---|---|
| 4,753,618 A | 6/1988 | Entringer | |
| 6,124,709 A * | 9/2000 | Allwine | G01B 7/30 324/207.2 |
| 6,942,530 B1 | 9/2005 | Hall et al. | |
| 7,836,787 B2 | 11/2010 | Oguma | |
| 8,961,246 B1 | 2/2015 | Kirchhoff et al. | |
| 9,043,058 B1 | 5/2015 | Camp et al. | |
| 9,422,047 B1 | 8/2016 | Camp et al. | |
| 9,493,220 B2 | 11/2016 | Kirchhoff et al. | |
| 2003/0111024 A1* | 6/2003 | Venturoli | F02P 1/086 123/41 E |
| 2009/0020092 A1* | 1/2009 | Kishibata | F02D 41/062 123/179.3 |
| 2015/0115630 A1* | 4/2015 | Tarr | D06F 34/20 292/251.5 |
| 2016/0245395 A1* | 8/2016 | Hong | F16H 59/04 |
| 2017/0133138 A1* | 5/2017 | Bye | G01D 5/145 |
| 2018/0003532 A1* | 1/2018 | Vanberg | F24D 19/10 |
| 2019/0140524 A1* | 5/2019 | Wolschlager | H02K 7/003 |

* cited by examiner

*Primary Examiner* — Michael C Zarroli
(74) *Attorney, Agent, or Firm* — Nolan IP Law; Jason M. Nolan

(57) ABSTRACT

A system and method of interrupting power to an ignition coil in a marine engine during an actuation of a shift cable for transitioning between gears is provided. The method includes connecting a sensor assembly to the shift cable. The sensor assembly includes magnets, a Hall sensor for magnetic sensing, and a control circuit. The magnets are configured to pass by the Hall sensor, which senses a change in polarity of the magnets. The control circuit is configured to interrupt power to the ignition coil. The method includes sensing a polarity of the magnets; determining if the polarity of the magnets has changed; and sending a signal to the control circuit based on the change in polarity of the magnets, which causes an output interrupting power to the ignition coil.

16 Claims, 7 Drawing Sheets

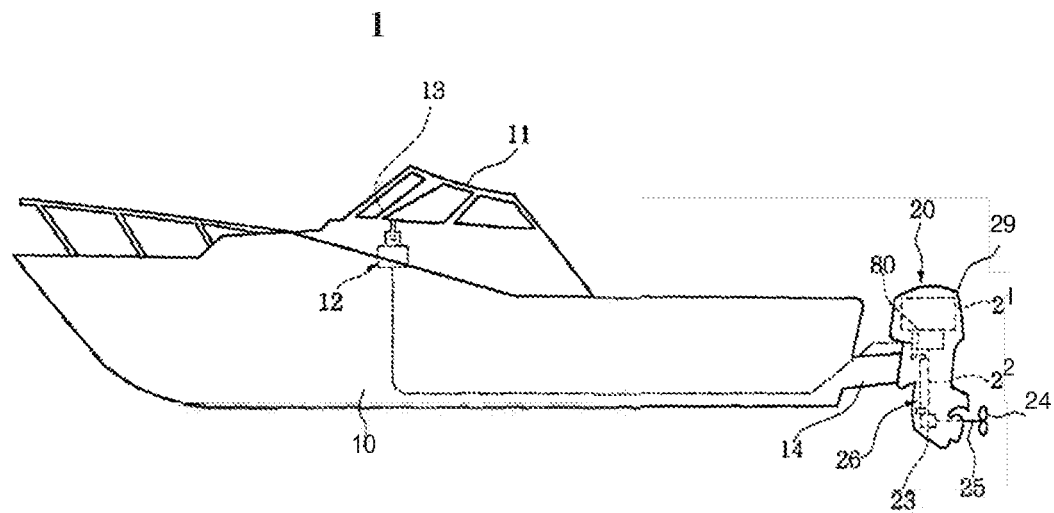
FIG. 11 - *PRIOR ART*
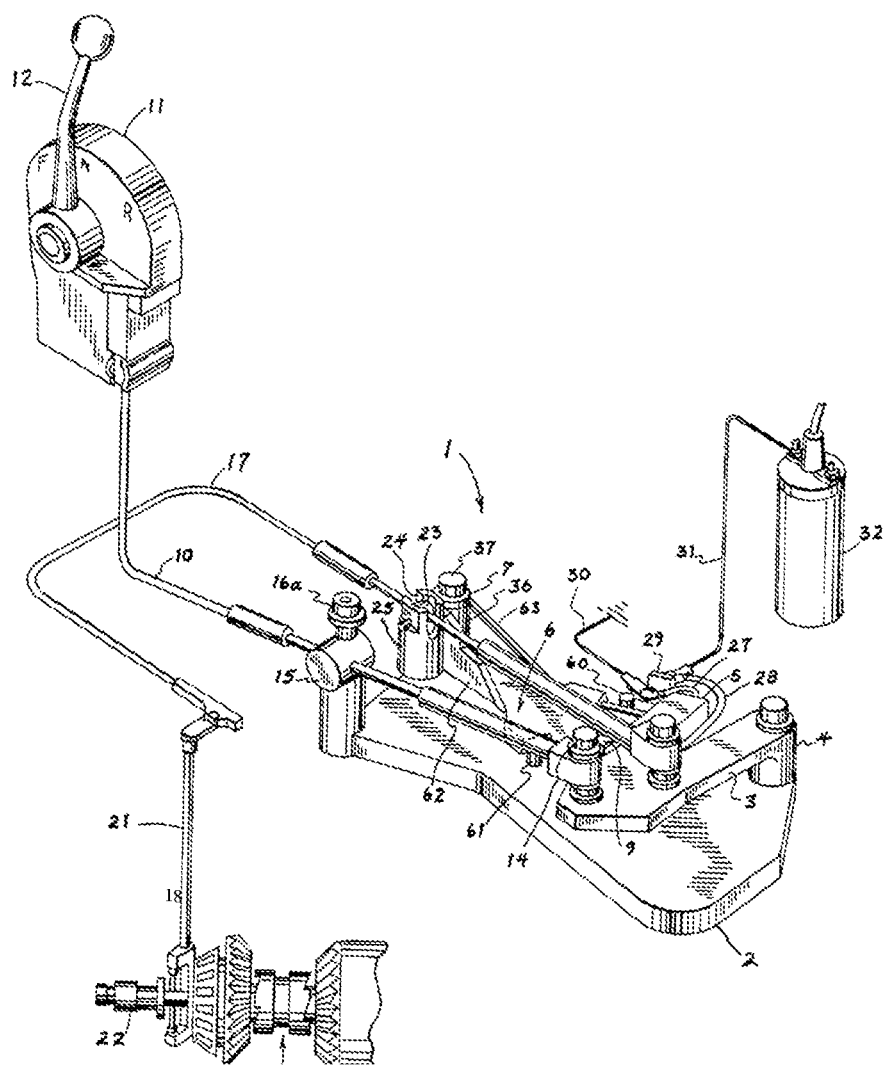
FIG. 12 - *PRIOR ART*

SHIFT INTERRUPT METHOD FOR A MARINE PROPULSION SYSTEM

FIELD

The present disclosure generally relates to marine engines, and more particularly to a device designed to retrofit a marine propulsion system and a method of facilitating a shift interrupt for the marine propulsion system.

BACKGROUND

U.S. Pat. No. 6,942,530 discloses a shift control strategy based on boat speed and engine temperature to facilitate shift. According to the patent, it is known in the art of marine propulsion systems that shifting from one gear position to another (e.g., from neutral to either forward or reverse gear) can result in impact noise and shock to the drive unit, and one method for addressing those problems is to deprive one or more cylinders of the engine from an ignition spark during the shift event.

U.S. Pat. No. 8,961,246 discloses a shift control strategy based upon position thresholds. The strategy uses a potentiometer and an analog-to-digital converter in conjunction with a micro controller. The shift control system includes a programmable control circuit and includes a microprocessor and memory.

U.S. Pat. No. 7,836,787 discloses a shift system for a boat propulsion unit. According to the patent, conventional boat propulsion units have a shift system for controlling forward, neutral, and reverse operation of a boat, the shift system including a normal turn gear and a reverse turn gear meshing with right and left sides of a drive gear coupled to a drive shaft extending from the engine. A dog clutch shift transmits the rotation of the normal or reverse gear to the propeller shaft, and a shift rod is used to slide the dog clutch to right and left directions. FIG. 1 of U.S. Pat. No. 7,836,787, showing a side view of a boat provided with a shift system for the marine engine, has been reproduced in this description as FIG. 11.

U.S. Pat. No. 9,422,047 discloses a shift system and method for facilitating shift changes in marine propulsion devices. The system and method use an idle air control and timing valve. The system and method also use a potentiometer and an analog-to-digital converter in conjunction with a micro controller. The shift control system includes a programmable control circuit and includes a microprocessor and memory. According to the patent, existing systems included the shift cable assembly disclosed in U.S. Pat. No. 4,753,618. FIG. 1 of U.S. Pat. No. 4,753,618 shows the shift cable 10 connected to a shift plate assembly comprising the switch actuating arm 6, which is attached to the shift plate 2, and the coil 32, which is also connected to the shift plate 2. FIG. 1 of U.S. Pat. No. 4,753,618 shows the remote control box 11 and the shift control arm 12, which are connected to the shift cable 10 to allow a user to switch the marine drive between a forward draft position F, a neutral position N, and a reverse drive position R. FIG. 1 of U.S. Pat. No. 4,753,618 has been reproduced in this description as FIG. 12.

U.S. Pat. No. 9,493,220 discloses a shift system that uses a potentiometer and an analog-to-digital converter in conjunction with a micro controller. According to the patent, the system includes a conventional dog clutch for actuating between forward gear, neutral gear, and reverse gear by a shift rod. The system includes an operator control lever that is a combination shift/throttle lever, which is connected to a shift linkage and shift link that translates movement of the control lever to the shift rod and marine propulsion device for causing a shift event (i.e., a change in gear) in the clutch. The shift control system includes a programmable control circuit and includes a microprocessor and memory.

U.S. Pat. No. 9,043,058 discloses a shift system having a potentiometer and an analog-to-digital converter in conjunction with a micro controller. The shift control system includes a programmable control circuit and includes a microprocessor and memory.

The above-mentioned systems generally work by interrupting the engine ignition coil to kill the engine briefly enough to allow the dog clutch to release and therefore allow a neutral gear to be achieved. These systems use a micro switch that is activated by tension exerted on the lower shift cable. This tension arises when the dog clutch is transitioning and trying to come out of gear into neutral. As a result, the above-mentioned methods can stretch the shift cable over time and eventually lead to failure, as well as requiring replacement of the cable. Additionally, the micro switches wear out and start activating erroneously, and are generally unreliable. The traditional micro switch methods do not interrupt the engine when transitioning from neutral into gear which causes grinding and hard shifting.

SUMMARY

In various embodiments, a method to input a shift delay using a Hall effect sensor latch is provided. The Hall sensor may either contain a built-in latch or an external latch circuit. Shifting is implemented only when the Hall sensor detects a change in position and direction of passing magnets. In some embodiments, the Hall sensor detects a change in polarity from north to south and activates the shift delay. A subsequent change in polarity from south to north resets the circuit so it is ready to be triggered again by a north to south polarity, or vice versa, depending upon the pole orientation of the magnets. In some embodiments, the width of the magnets can be modified (e.g., increased) to change the length of time of the shift interrupt.

In various embodiments, a method to control and use the information obtained from the Hall sensor 104 to accurately control the time in which the engine ignition coil (e.g., component 32 in FIG. 12) is interrupted is provided. In such embodiments, the Hall sensor 104 directly "triggers" a One Shot circuit (monostable circuit) 114, which then provides an output of the method, for a duration determined by an RC time constant adjusted via a potentiometer.

In various embodiments, a method to interrupt the engine ignition coil using a specified time duration is provided. In such embodiments, the positive connection to the engine ignition coil may be interrupted via a "normally closed" relay, MOSFET, IGBT, or solid-state equivalent. Alternatively, the ignition coil may be grounded out via a "normally open" relay, MOSFET, IGBT, or solid-state equivalent.

In various embodiments, an alternative method of using a logic circuit or flip flop circuit is provided. In such embodiments, the circuit is configured to remember the last output state of the Hall sensor 104.

In various embodiments, a method comprising the ability to monitor the engine RPMs and to add or subtract capacitance or resistance in the RC time circuit to change the delay interrupt time accordingly is provided.

BRIEF DESCRIPTION OF THE DRAWINGS

FIG. 11 is a prior art illustration showing a side view of a boat provided with a shift system for the marine engine; and FIG. 12 is prior art illustration showing a schematic view of a shift cable assembly for a marine drive that incorporates a shift plate assembly having a switch actuating arm.

DETAILED DESCRIPTION

In existing systems, the shift interrupt commands are determined by a control circuit that monitors the position of a potentiometer or the activation of a switch, and a microprocessor and/or computer that uses such information to determine when and how long to initiate a shift interrupt. By contrast, in the embodiments described herein, a device 100 is provided for actuating a method comprising the use of one or more Hall sensors 104 and magnets 106a and 106b as interrupt trigger points. In such embodiments, the placement and pole orientation of the magnets 106a and 106b will determine when to send a shift interrupt signal directly. In such embodiments, the timing is adjustable by moving the magnets to a different position. In some embodiments, the width of the magnets can be modified (e.g., increased) to adjust (e.g., lengthen) the time of the shift interrupt. In such embodiments, the control circuit 114 is a RC time circuit used to control the duration of the interrupt and to activate a relay (or solid state similar or equivalent).

Figure 4:
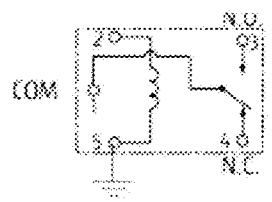
FIG. 4 is an Output Relay of the One Shot control circuit of the embodiments described herein.
Figure 5:
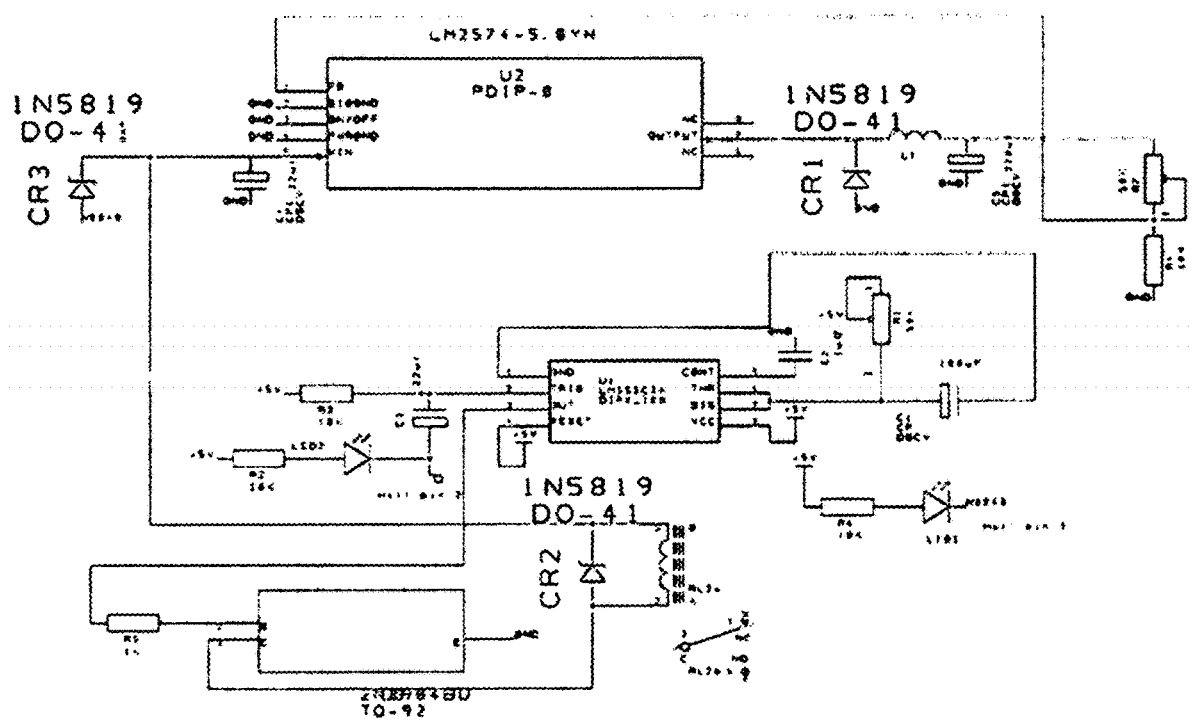
FIG. 5 is the production circuit of the embodiments described herein.
Figure 6:
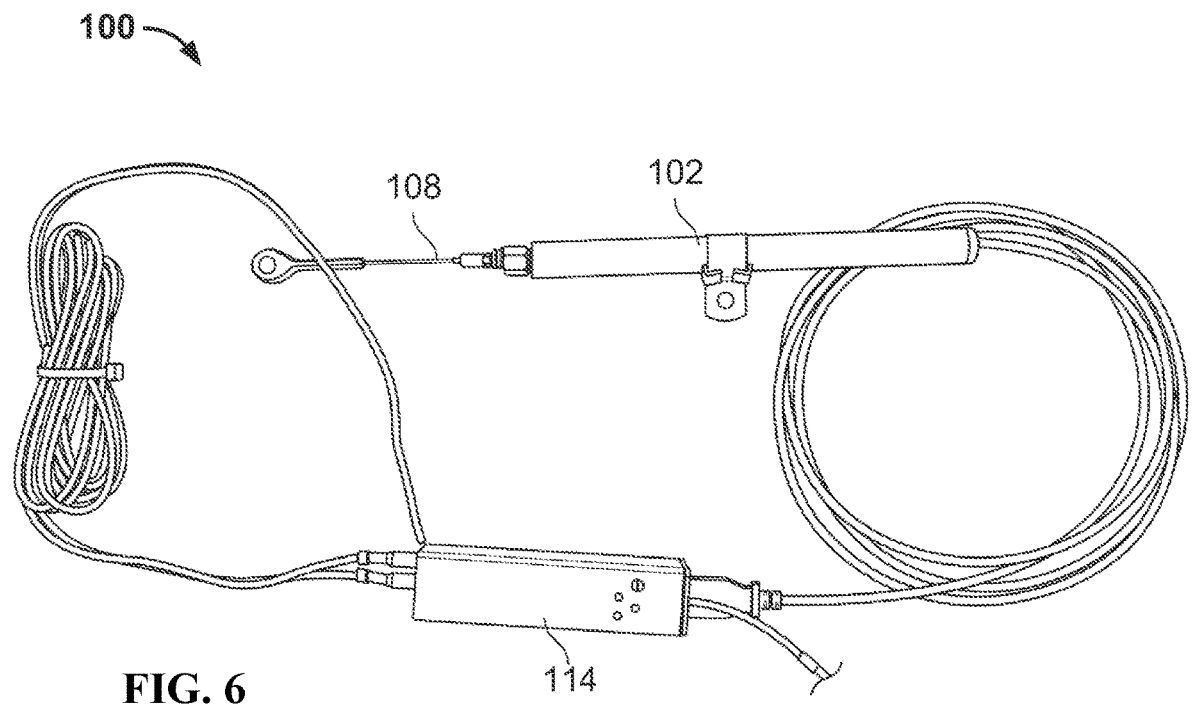
FIG. 6 is a perspective view of a sensor assembly, in accordance with embodiments described herein.
Figure 7:
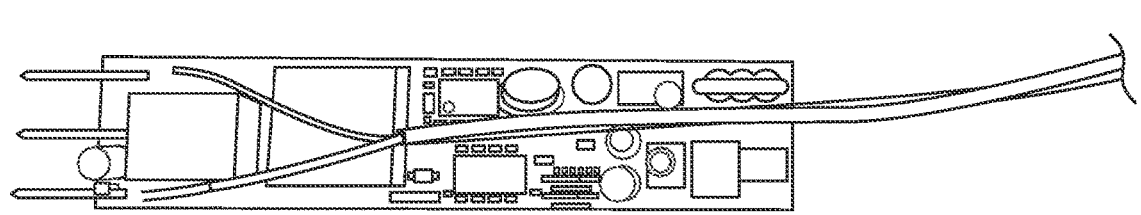
FIG. 7 is a plan view of the control circuit in the sensor assembly in FIG. 6.

FIG. 5 is the production circuit of the various embodiments described herein. In some embodiments, the production circuit comprises features from the components described in FIGS. 2, 3, and 4, and further comprises a power supply circuit. In FIG. 5, the connection points labeled "Hall pin 2" and "Hall pin 3" refer to Hall sensor pins 2, 3 in FIG. 3.

Figure 1:
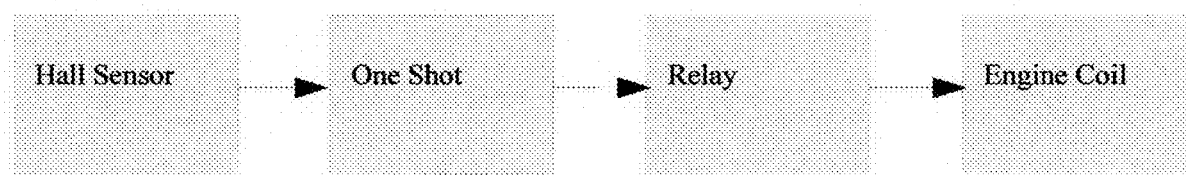
FIG. 1 is a Simple Block Diagram of the embodiments described herein.
Figure 2:
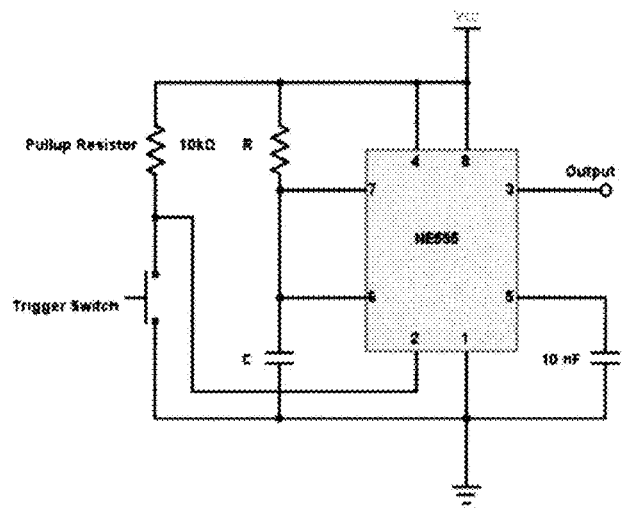
FIG. 2 is a One Shot Monostable Multi-Vibrator control circuit of the embodiments described herein.

FIG. 2 is a One Shot monostable multi-vibrator control circuit. As implemented in the production circuit shown in FIG. 5, the values of R (resistance) and C (capacitance) determine the duration of the output pulse width according to the formula:

$$\text{Time} = R \times C.$$

In such embodiments, when the pin 2 in FIG. 2 detects a falling edge, the circuit is triggered for a duration of time determined by the RC time constant.

Figure 3:
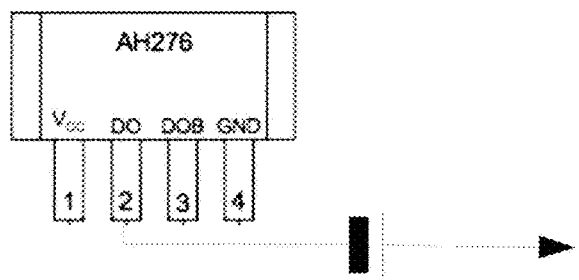
FIG. 3 is a Hall sensor trigger circuit of the embodiments described herein.

In some embodiments, the Hall effect sensor latch in FIG. 3 toggles its output like a "flip flop circuit" based upon the direction of a passing magnetic field, as noted in the Data Sheet for Hall Effect Latch AH276. In some embodiments, as shown in FIGS. 6-10, the sensor assembly 100 comprises two components: the Hall sensor 104 and the magnet assembly having a shift arm connecting rod 108, and indicator 110, and magnets 106a and 106b, which are contained within an inner housing 103 and an outer housing 102. In some embodiments, the outer housing 102 comprises a window 112 for observing the position of the indicator 110. In such embodiments, the magnets 106a and 106b are moveable about the shift arm connecting rod 108 to determine when the Hall sensor 104 is triggered and the length of time it is triggered for, thus implementing a shift interrupt.

Figure 8:
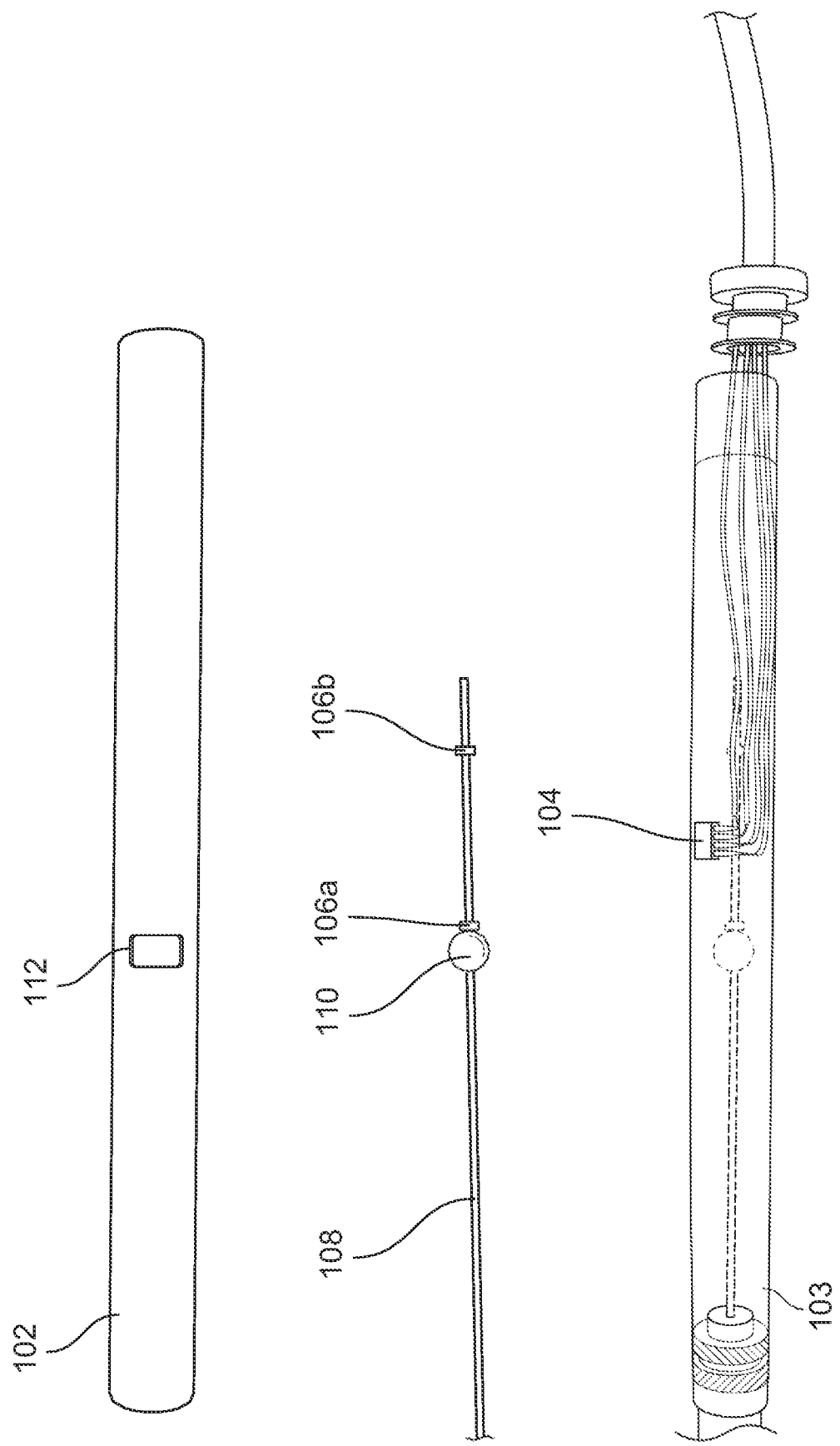
FIG. 8 is an exploded view of the sensor assembly in FIG. 6.
Figure 9:
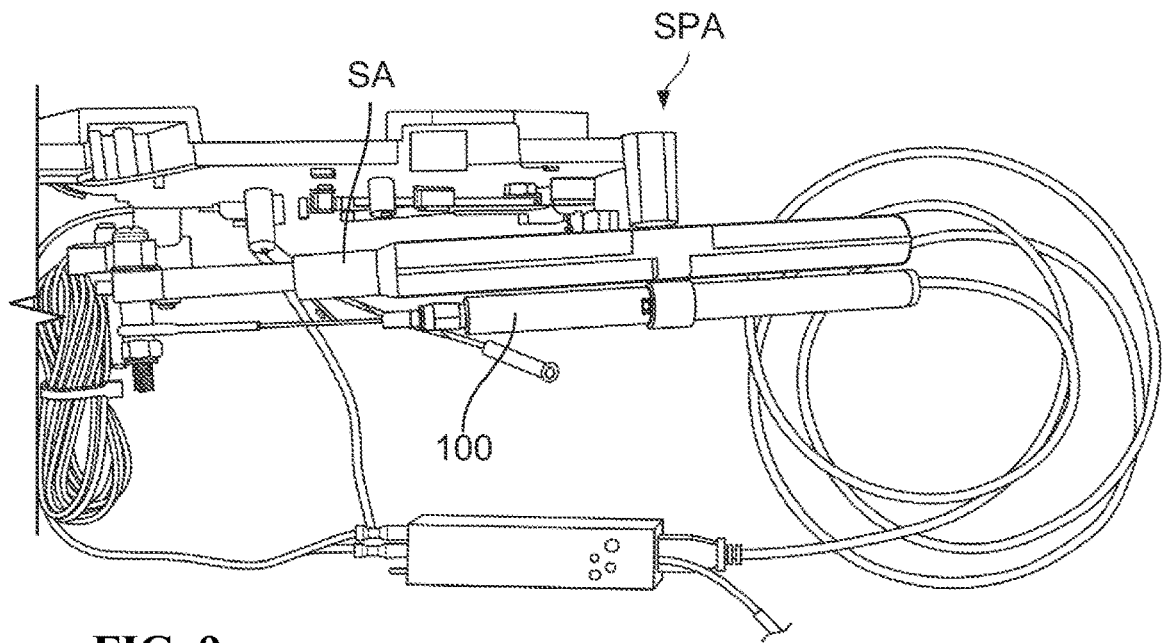
FIG. 9 is a top environmental view showing the sensor assembly 100 in FIG. 6 installed on the shift arm (SA) of a shift plate (SP) and shift plate assembly (SPA) of a marine engine.
Figure 10:
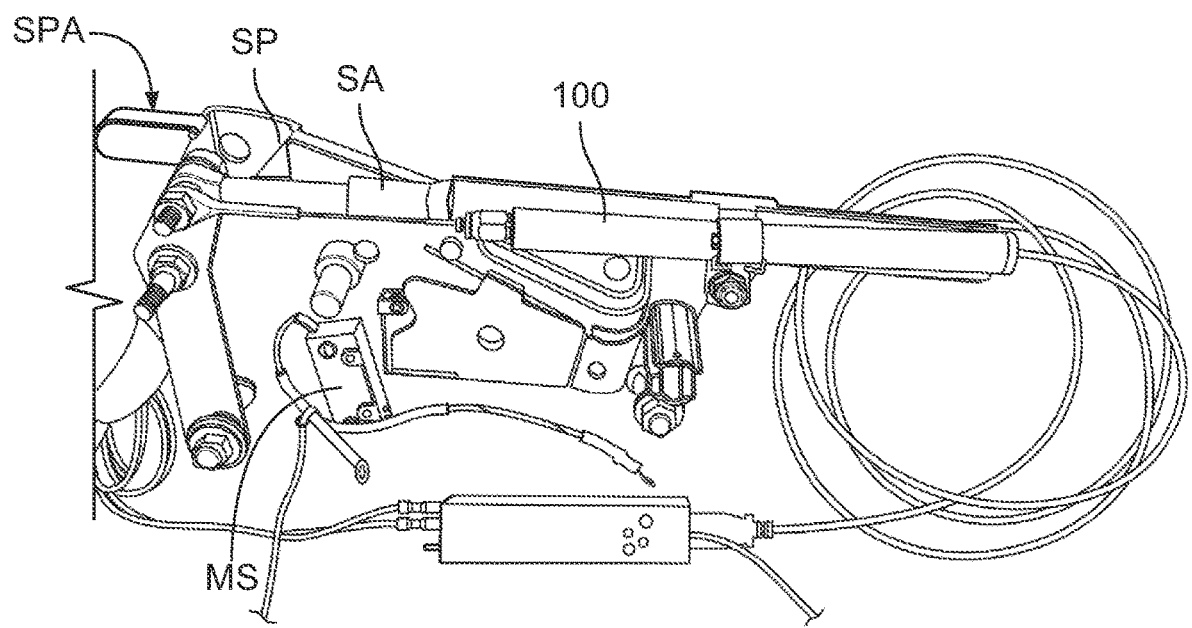
FIG. 10 is a perspective environmental view showing the sensor assembly in FIG. 6 installed on the shift arm (SA) of a shift plate (SP) and shift plate assembly (SPA) of a marine engine.

In FIGS. 3 and 8, pin 2 (DO) and pin 3 (DOB) are the "toggle" outputs. As implemented in the production circuit shown in FIG. 5, when the Hall sensor 104 detects a magnet 106a or magnet 106b passing from North to South, the output at pin 2 turns on and the output at pin 3 turns off, depending on the pole orientation of the magnets. When the Hall sensor 104 detects a magnet 106a or magnet 106b passing from South to North, the output at pin 3 turns on and the output at pin 2 turns off, depending on the pole orientation of the magnets 106a and 106b. In some embodiments, the duration of the toggle output is increased. In some embodiments, the duration of the toggle output is directly proportional to the width of the magnets.

In various embodiments, the magnets 106a and 106b are arranged about the shift arm connecting rod 108 in a particular pole arrangement. In such embodiments, a transition of magnetic poles (i.e., North to South or South to North) causes the Hall sensor 104 to toggle its output and latch. Once latched to a specific output, a transition to another direction toggles and latches to another output. This output toggle state is directly used to trigger a mono stable multivibrator circuit that has an RC time circuit that controls the time length of the shift interrupt.

FIG. 3 is a Hall sensor trigger circuit. As implemented in FIGS. 5, 6, 7, 9, and 10, the Hall sensor trigger circuit is substituted for the "Trigger Switch" identified in FIG. 2. In such embodiments, a passing magnetic field causes the DO output to turn on or off. In such embodiments, the DO output is coupled through the capacitor to the trigger (pin 2) shown in FIG. 2. In some embodiments, the above-described Hall sensor 104 sends its output state to pin 2 of the circuit, as shown in FIG. 3.

FIG. 4 is an output relay. As implemented in the production circuit shown in FIG. 5, the output of the One Shot monostable multi-vibrator control circuit momentarily powers pin 2 of the relay coil. In such embodiments, the engine ignition coil is interrupted by either "opening" or "closing" the relay coil's power via the COM+N.C. (normally closed, pin 4) or the COM+N.O. (normally open, pin 3) relay connections, as shown in FIG. 4.

In some embodiments, when the input (pin 2) of the 555 timer chip is lower than ⅓ of the input voltage $V_{CC}$, the Monostable circuit is triggered and provides an output at pin 3, which turns on a transistor to provide power to the output relay.

In some embodiments, the duration of time the relay stays on is determined by the RC time constant of (C1 and R1). In such embodiments, R1 is a potentiometer, which is adjustable by the user to determine the maximum interrupt duration without stalling the engine. In such embodiments, the device described herein is advantageous because it is relatively inexpensive to make and easy to install on existing marine engines. Additional advantages include its capability to interrupt when transitioning from neutral into gear.

In some embodiments, shifting is determined by the placement of magnets 106a and 106b relative to the Hall sensor 104. Once these magnets 106a and 106b are aligned properly, shifting is reliable and consistent. In such embodiments, a shift interrupt can occur when transitioning from neutral into gear (e.g., forward or reverse), which reduces grinding and helps ensure a smooth shift. Furthermore, the embodiments described herein comprise less components to wear-out compared to existing systems because the shift interrupt device is electronic and uses Hall sensors instead of a plurality of moving parts.

In various embodiments, the device and method described herein uses a USB cable to connect the Hall sensor and the monostable circuit. In some embodiments, alternative methods of interconnection familiar to those skilled in the field of electronics may be used. In some embodiments, the Pin 2 of the Hall sensor in FIG. 2 provides an input to the monostable multivibrator circuit in FIG. 3 via a coupling capacitor ("C3" in FIG. 5). In the schematic and device, the monostable multivibrator circuit is designed using a 555 timer chip. In some embodiments, other circuits can be used. In such alternatives, the design of the monostable multivibrator using other circuits would be obvious to those skilled in the field of electronics.

In various embodiments, the circuit shown in FIG. 5, and a device 100 for implementing the same, as shown in FIGS. 6-10, are configured to retrofit existing systems, such as, for example, the system disclosed in U.S. Pat. No. 4,753,618 (FIG. 12), or any other system utilizing a micro switch (MS) to perform a shift interrupt. In some embodiments, the circuit shown in FIG. 5 and a device for implementing the same can be configured for new systems. In such embodiments, a shift interrupt is implemented and triggered directly from a Hall sensor and a One Shot circuit. Specifically, the system interrupts the engine coil when the position of the shift cable causes the Hall sensor to detect a change in the direction and/or width of the magnetic fields. In such embodiments, the magnets move across the Hall sensor when the marine engine operator is shifting gears.

The invention claimed is:

1. A method of interrupting power to a coil in a marine engine during an actuation of a shift cable for transitioning between gears, comprising:
   connecting a sensor assembly to the shift cable, the sensor assembly comprising magnets, a Hall sensor for magnetic sensing, and a control circuit,
      wherein the magnets are arranged in the sensor assembly to pass by the Hall sensor during the actuation of the shift cable;
      wherein the Hall sensor senses a change in polarity of the magnets; and
      wherein the control circuit is configured to interrupt power to the coil;
   sensing a polarity of the magnets;
   determining if the polarity of the magnets has changed; and
   sending a signal to the control circuit based on the change in polarity of the magnets, wherein the change in the polarity of the magnets provides an output interrupting power to the coil.

2. The method of claim 1, wherein the output interrupting power to the coil is for a duration determined by an RC time constant that is adjustable via a potentiometer.

3. The method of claim 1, wherein the control circuit does not use a computer or micro-controller.

4. The method of claim 1, wherein the sensor assembly is installed on a marine engine after-market.

5. The method of claim 1, wherein the Hall sensor comprises a built-in latch circuit or an external latch circuit.

6. The method of claim 1, wherein the sensing results from a shift event in the marine engine from a neutral gear position.

7. The method of claim 1, wherein the Hall sensor further senses a change in direction of the magnets.

8. The method of claim 7, wherein the output interrupting power to the coil is implemented after the Hall sensor detects the change in polarity and direction of the passing magnets.

9. A shift control system for interrupting power to a coil in a marine engine during an actuation of a shift cable for transitioning between gears, comprising:
   a sensor assembly comprising magnets, a Hall sensor for magnetic sensing, and a control circuit, wherein the sensor assembly is configured for attachment to the shift cable;
   wherein the Hall sensor senses a change in polarity of passing magnets; and
   wherein the Hall sensor sends a signal to the control circuit based on the change in polarity of the magnets, wherein the change in the polarity of the magnets provides an output interrupting power to the coil.

10. The system of claim 9, wherein the output interrupting power to the coil is for a duration determined by an RC time constant that is adjustable via a potentiometer.

11. The system of claim 9, wherein the control circuit does not use a computer or micro-controller.

12. The system of claim 9, wherein the sensor assembly is installed on a marine engine after-market.

13. The system of claim 9, wherein the Hall sensor comprises a built-in latch circuit or an external latch circuit.

14. The system of claim 9, wherein the sensing of the change in polarity of passing magnets results from a shift event in the marine engine from a neutral gear position.

15. The system of claim 9, wherein the Hall sensor further senses a change in direction of the magnets.

16. The system of claim 15, wherein the output interrupting power to the coil is implemented after the Hall sensor detects a change in polarity and direction of the passing magnets.

* * * * *